United States Patent [19]

Paullus

[11] 4,453,131
[45] Jun. 5, 1984

[54] TRANSFORMER COUPLED AMPLIFIER CIRCUIT

[75] Inventor: Jeffrey O. Paullus, Memphis, Tenn.

[73] Assignee: Auditronics, Inc., Memphis, Tenn.

[21] Appl. No.: 429,793

[22] Filed: Sep. 30, 1982

[51] Int. Cl.³ .............................................. H03F 1/32
[52] U.S. Cl. ..................................... 330/97; 330/109; 330/196
[58] Field of Search ................... 330/97, 99, 100, 103, 330/195, 196, 109, 107, 85, 259, 260

[56] References Cited

U.S. PATENT DOCUMENTS 4,253,070 2/1981 Carlsen ............................... 330/260

Primary Examiner—James B. Mullins
Assistant Examiner—Steven J. Mottola
Attorney, Agent, or Firm—Walker & McKenzie

[57] ABSTRACT

A transformer coupled amplifier circuit that eliminates transformer induced non-linearities by way of a dual feedback path without sacrificing any of the inherent attributes of general transformer coupled amplifiers.

4 Claims, 5 Drawing Figures

TRANSFORMER COUPLED AMPLIFIER CIRCUIT

BACKGROUND OF THE INVENTION

1. Field of the Invention

The present invention relates to a transformer coupled amplifier circuit that eliminates transformer induced non-linearities by way of a unique dual feedback path without sacrificing any of the inherent attributes of general transformer coupled amplifiers.

2. Description of the Prior Art

Traditionally, in audio circuitry any situation calling for long wire runs or a very good source/load isolation automatically dictated the use of a transformer at the send and receive end of the wire run. While the transformer effectively isolated the load from the drive source, (up to the physical limitation of the particular transformer involved), it introduced severe signal degradation each time a transformer in/out pair was employed. In very early circuit applications, this signal degradation tended to be less than that of the driving/receiving circuitry. With the coming of solid-state circuits utilizing large amounts of negative feedback, the signal degradation occurred exclusively inside the transformer. Typical prior transformer coupled amplifier circuits of this type are shown in FIGS. 3, 4, and 5 between drive circuits and driven circuits and including transformers T, amplifiers A, and a number of resistors R. In the circuit shown in FIG. 3, the signal transfer function of the transformer T is not linear and this transfer function is well documented. Some amount of optimization could, however, allow the transformer T to perform reasonably well over some portion of the audio spectrum (20 Hertz to 20,000 Hertz). The major problems occur at frequencies below 250 Hertz. High non-linearity and phase shift become nearly intolerable for high quality audio applications. These problems are due primarily to decreasing impedance of the primary winding (since it is inductive). The only way to correct for this problem was to increase the number of turns of wire on the windings or increasing the amount of ferrous material in the core. Either solution results in a transformer far too large for use. What this meant to audio circuit designers is that for the ultimate in performance, transformers were to be avoided. Even with the most perfectly optimized transformers, distortion and phase shift were always present at audio frequency extremes and/or high signal levels. And the designers couldn't have a circuit with all parameters optimized, while keeping that total transformer isolation.

It was discovered that if one could "pick-off" part of the magnetic (highly nonlinear) signal within the transformer and apply it along with normal negative feedback signal, a percentage of the non-linearities could be cancelled. In some cases a totally separate winding used only for negative feedback was employed. This resulted in circuits similar to that shown in FIG. 4. In this circuit, the resistor $R_1$ applies a feedback signal to the amplifier A and causes a reduction in non-linearities in driven circuit. The ideal situation where the resistor $R_F$ equals infinite ohms, would totally derive the feedback signal from the transformer. In real circuits $R_F$ must be some finite value in order to provide a direct current negative feedback path for the amplifier. For the circuit shown in FIG. 4, the direct current gain equals the value of the resistor $R_F$ divided by the value of the resistor $R_{IN}$. Normal amplifiers having input offsets of several millivolts could develop large values of direct current voltage at point X in the circuit. Since, for direct current, the transformer windings present minimal resistance depending on the value of the resistor $R_G$, output overload can occur very rapidly for high values of the resistor $R_F$ and hence, large amount of direct current. As we lower the value of the resistor $R_F$ we diminish the effect of the resistor $R_1$ and subsequently swamp-out all the benefit derived from employing the transformer signal feedback path. Another factor in such a circuit is stability. As the resistors $R_1$ and $R_F$ approach each other, in value, it becomes increasingly difficult to create a stable circuit offering any advantages.

In the circuit shown in FIG. 5, a differential amplifier A actually "watches" the transformer output and derives a negative feedback signal that is applied through the resistor $R_1$. Immediately, the total isolation offered by the transformer T is lost due to the attachment of the amplifier $A_2$. In addition, the swamping-out effect of the improvement derived from the amplifier $A_2$ path, by the direct current feedback path of the resistor $R_2$, causes only a small amount of improvement.

None of the prior art transformer coupled amplifier circuits, taken as a whole, disclose or suggest the present invention.

It will be understood that in the drawings of the circuits in FIGS. 3, 4, and 5 that $R_G$ models the resistive component of the input windings of the transformer.

SUMMARY OF THE INVENTION

The present invention is directed toward providing a transformer coupled amplifier circuit that will cancel transformer induced non-linearities. The concept of the present invention is to provide such a circuit that employs separate negative feedback loops (i.e., an A.C. feedback path and a separate D.C. feedback path) to cancel transformer induced non-linearities.

The transformer coupled amplifier circuit of the present invention includes, in general, an input conditioning means for receiving and conditioning an incoming audio frequency signal and for providing a pair of conditioned output signals; a differential amplifier means for receiving and amplifying the difference between the conditioned output signals of the input conditioning means and for providing a single ended output signal having, in part, a direct current voltage; a current booster means for receiving and boosting the voltage of the single ended output signal of the differential amplifier means; an output transformer means for receiving and isolating the single ended output from the current booster means and for providing an alternating current feedback signal; and alternating current feedback means for scaling and conditioning the feedback signal of the output transformer means for feedback to the differential amplifier means; an inverting amplifier means for monitoring the direct current voltage of the output signal of the differential amplifier means and for providing a direct current error signal; and a direct current feedback means for scaling and conditioning the direct current error signal of the inverting amplifier means for feedback to the differential amplifier means.

An object of the present invention is to provide a transformer coupled amplifier circuit in which the amount of distortion is as low as a non-transformer coupled amplifier while maintaining a transformer isolated output such that there is a very high voltage barrier between the drive and driven circuits so that any fault conditions in a long wire run will not be reflected back into the driving amplifier.

DESCRIPTION OF THE PREFERRED EMBODIMENT

Figure 1:
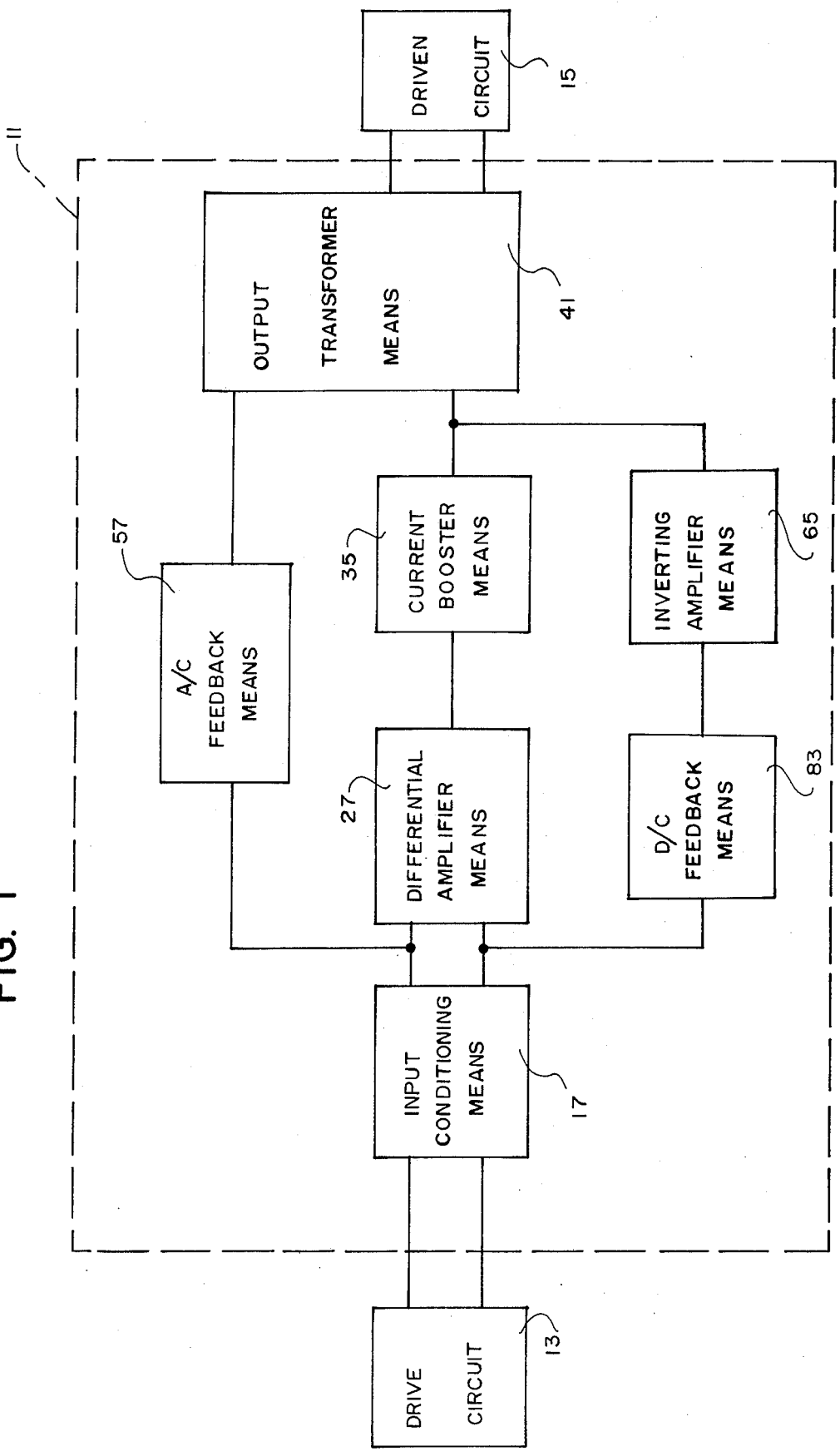
FIG. 1 is a block diagram of the transformer coupled amplifier circuit of the present invention shown coupled between a drive circuit and a driven circuit.

The transformer coupled amplifier circuit 11 of the present invention is used to transform electrical energy from one or more drive circuits 13 to one or more driven (or load) circuits 15 at the same frequency. The circuit 11 is especially adapted to eliminate transformer induced non-linearities by way of dual feedback paths.

The circuit 11 includes an input conditioning means 17 for receiving and conditioning a pair of input voltage signals from the drive circuit 13. The input conditioning means 17 may simply consist of a first resistor 19 electrically coupled to a lead 21 through which a first (e.g., a positive) input voltage signal passes from the drive circuit 13, and a second resistor 23 electrically coupled to a lead 25 through which a second (e.g., a negative) input voltage signal passes from the drive circuit 13 (see FIG. 2).

The circuit 11 includes a differential amplifier means 27 for receiving and amplifying the difference between the pair of conditioned output signals of the input conditioning means 17 and for providing a single ended output signal having, in part, a direct current voltage. The differential amplifier means 27 consists simply of a typical high gain differential amplifier 29 (i.e., an operational amplifier) with two inputs and one output. The positive input of the amplifier 29 is preferably electrically coupled to the first resistor 19 of input conditioning means 17 by a lead 31 and the negative input of the amplifier 29 is preferably electrically coupled to the second resistor 23 of the input conditioning means 17 by a lead 33 (see FIG. 2).

In practice, a power booster (or current booster or amplifier of well known construction and shown diagrammatically as at 35) is needed on the output of amplifier 29 to drive the inherent winding resistance of the transformer 43. However, if differential amplifier 29 has sufficient drive capability to directly power the output transformer means 41, then current booster means 35 may be omitted and differential amplifier means 27 connected directly to the output transformer means 41.

Figure 2:
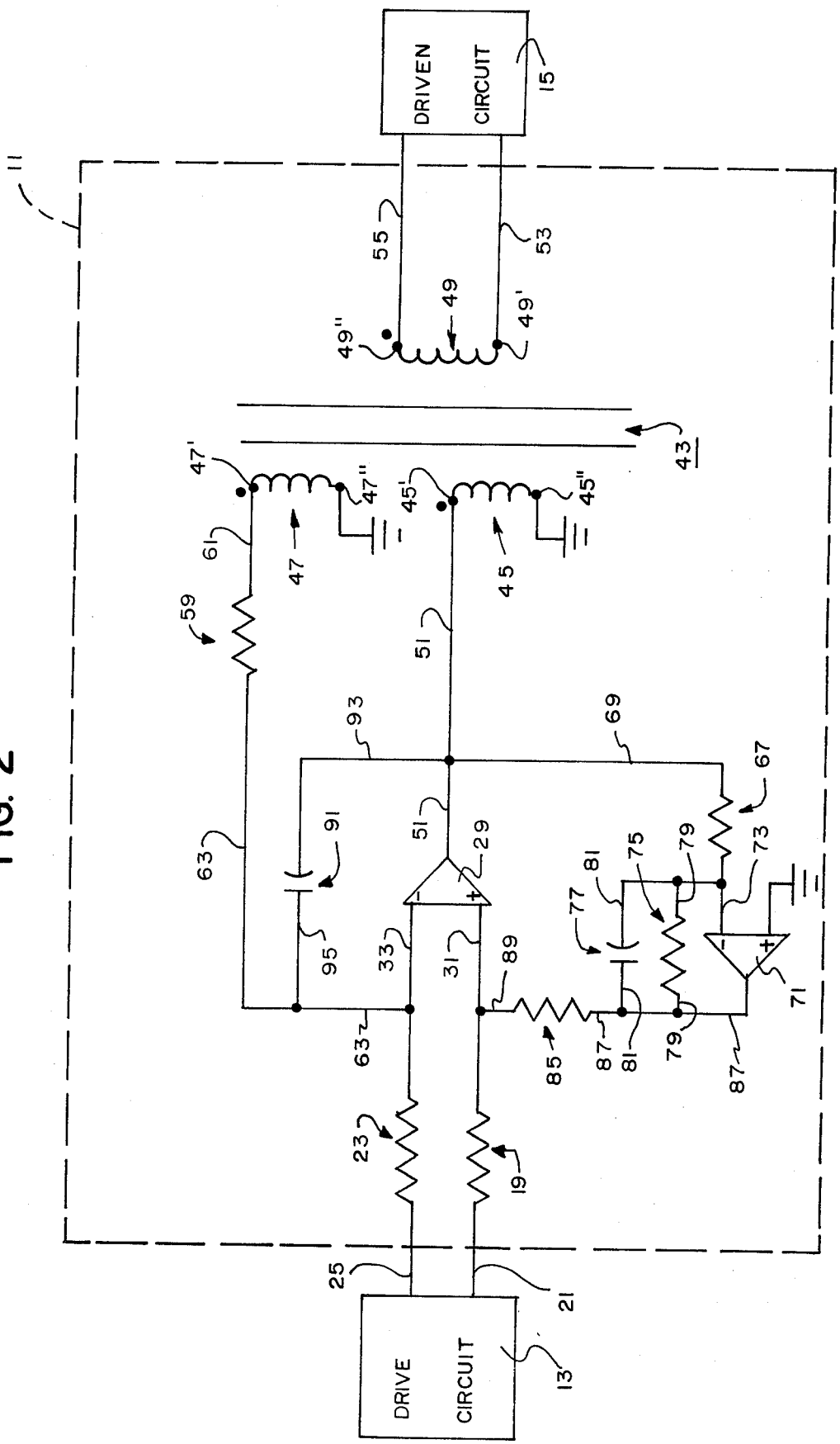
FIG. 2 is a schematic diagram of the transformer coupled amplifier circuit of the present invention shown coupled between a drive circuit and a driven circuit.
Figure 3:
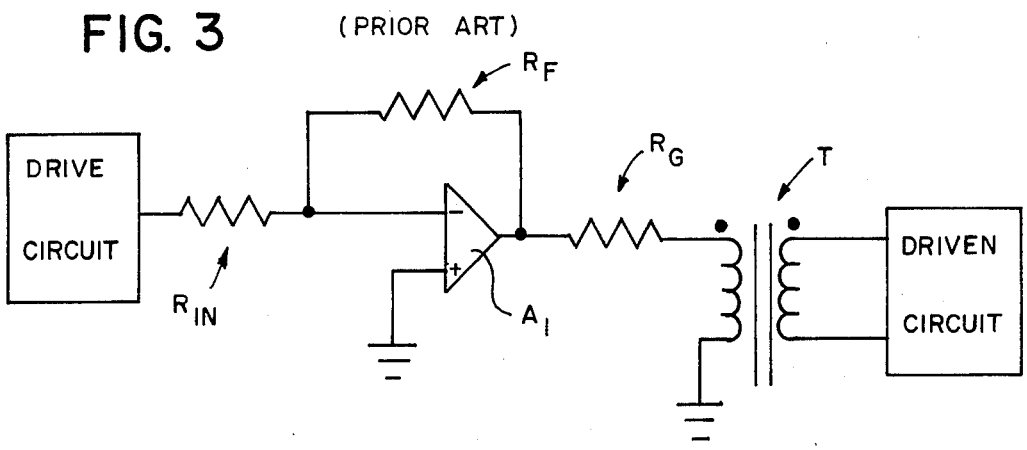
FIGS. 3, 4 and 5 are schematic diagrams of various prior art transformer coupled amplifier circuits shown coupled between drive circuits and driven circuits.
Figure 4:
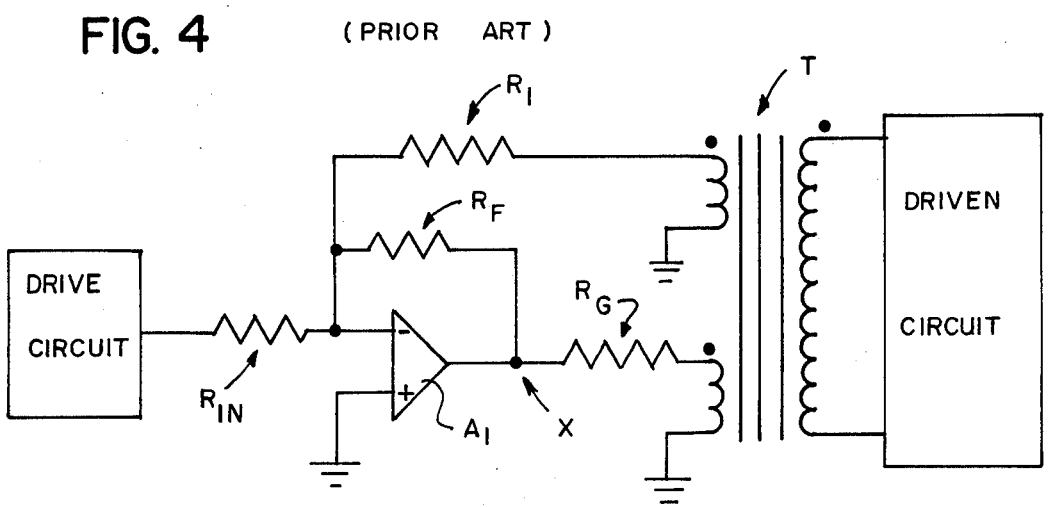
Figure 5:
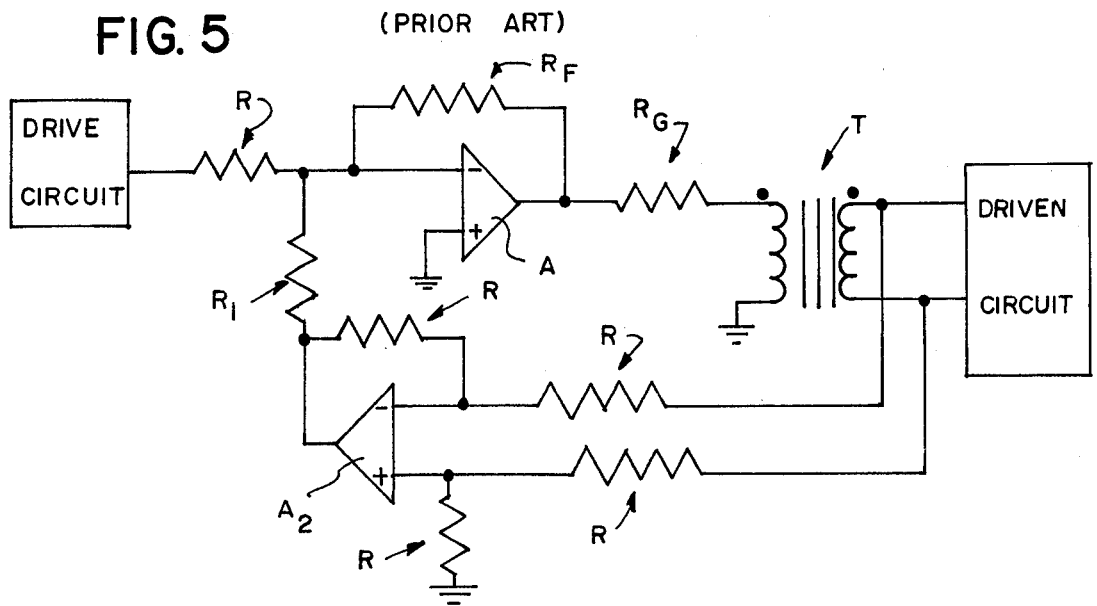

The circuit 11 includes an output transformer means 41 for receiving and isolating the single ended output from the current booster means 35 and for providing an alternating current feedback signal. The output transformer means 41 may consist simply of a typical three winding transformer 43. The transformer 43 includes a first primary winding 45 having a first end 45' and a second end 45", includes a second primary winding 47 having a first end 47' and a second end 47", and includes a secondary winding 49 having a first end 49' and a second end 49" (see FIG. 2). The amplifier 29 is electrically coupled to the first end 45' of the first primary winding 45 by a lead 51, as shown in FIG. 2. It will be understood that if a current booster 35 is used it will be interposed between amplifier means 27 and output transformer means 41 as shown in FIG. 1. The first end 45' of the first primary winding 45 is electrically coupled to the current booster means 35 by a lead 51. The second end 45" of the first primary winding 45 is electrically coupled to a ground. The first and second ends 49', 49" of the secondary winding 49 are electrically coupled to the driven circuit 15 by way of leads 53, 55.

The circuit 11 includes an alternating current feedback means 57 for scaling and conditioning the alternating current feedback signal of the output transformer means 41 for feedback to the differential amplifier means 27. The alternating current feedback means 57 may consist simply of a typical resistor 59 electrically coupled to the first end 47' of the second primary winding 47 of the transformer 43 by way of a lead 61 and electrically coupled to the negative input of the amplifier 29 by way of a lead 63 via the lead 33. The second end 47" of the second primary winding 47 of the transformer 43 is electrically coupled to a ground.

The circuit 11 includes an inverting low pass filter or integrator amplifier means 65 for monitoring the direct current voltage of the output signal of the differential amplifier means 27 and for providing a direct error signal. The inverting amplifier means 65 may include a typical resistor 67 electrically coupled to the output of the differential amplifier means 27 (i.e., the amplifier 29) by way of a lead 69 via the lead 51 and the current booster means 35. The resistor 67 should have a value larger than the reflective load impedance through the transformer 43. The inverting amplifier means 65 may also include a typical amplifier 71 having two inputs and a single output. The negative input of the amplifier 71 is preferably electrically coupled to the resistor 67 by way of a lead 73. The positive input of the amplifier 71 is preferably electrically coupled to a ground. The inverting amplifier means 65 may also include a typical resistor 75 and a typical capacitor 77 electrically bridging the negative input and the output of the amplifier 71 by way of leads 79, 81 as clearly shown in FIG. 2. The resistor 75 gives the amplifier 71 a direct current feedback under fault conditions.

The circuit 11 includes a direct current feedback means 83 for scaling and conditioning the direct current error signal of the inverting amplifier means 65 for feedback to the differential amplifier means 27. The direct current feedback means 83 may consist simply of a resistor 85 electrically coupled to the output of the amplifier 71 of the inverting amplifier means 65 by way of a lead 87 and electrically coupled to the positive input of the differential amplifier means 27 (i.e., the amplifier 29) by way of a lead 89 via the lead 31 (see FIG. 2). The resistor 85 serves to introduce the error voltage into the main amplifier circuit. Normally, the value of the resistor 85 will be larger than the resistor 19 to reduce the attenuation of the input signal by the voltage division between the resistors 19 and 85.

The circuit 11 may include a typical capacitor 91 electrically bridging the output and the negative input of the amplifier 29 by way of leads 93, 95 (see FIG. 2) to stabilize the amplifier 29 at frequencies outside the audio band. It will be understood that the capacitor 91 is a compensating capacitor to prevent high frequency oscillation.

The specific values of the various components will vary according to the specific use to which the circuit 11 is put. For example, the resistors 19, 23, 59, 85 may have a value of 10 kilohms, the resistor 67 may have a value of 30 kilohms, the resistor 75 may have a value of 1 megohm, the capacitor 77 may have a value of 10 microfarads, and the capacitor 91 may have a value of 100 picofarads.

The present invention provides a circuit that maintains total isolation between the drive and driven circuits with the voltage output totally isolated from any internal circuit operations, that fights to cancel all transformer non-linearities and improves distortion at low frequencies since the transformer is "inside" the loop, that virtually eliminates phase shift for the same reason, and that provides an output impedance that is not affected by transformer "reflected" impedances but is reduced to the value of the direct current resistance of the secondary winding. The topology of the circuit 11 is unique in that the alternating current and direct current negative feedback paths are totally independent. Thus, there is a separate operation of the circuit at low (D.C.) frequencies, where the inductive nature of the transformer 43 affects performance and at A.C. (normal frequencies), where transformer non-linearities affect performance.

In order to maintain direct current stability we have added the inverting amplifier means 65 for negative direct current feedback. The amplifier means 65 can be described as a servo-amplifier whose dominant pole [set by the formula: $1 \div 2\pi \times$ value of resistor 75 $\times$ value of capacitor 77] is at least 10 times below the lowest alternating current frequency of interest. Since the amplifier means 65 is inverting, the positive input of the amplifier means 27 can be used as the direct current negative feedback port. Any direct current voltage appearing at the output of the amplifier means 27 is removed by the negative feedback action of the amplifier means 65. The maximum value of direct current voltage that can be removed is determined by the maximum voltage swing of the amplifier means 65 and the impedance ratios of the resistor 19 to the resistor 85. With such a direct current feedback path, the full amount of alternating current negative feedback signal derived from the transformer means 41 can be applied to the inverting input of the amplifier means 27, thus eliminating the swamping-out effect witnessed in the prior art circuits previously described. If, in the circuit 11, the value of the resistor 59 equals that of the resistor 19 the value of the resistor 23 equals that of the resistor 85, then gain and frequency response can be determined from well-known classic operational amplifier models.

The non-inverting gain of the circuit 11 can be calculated by the formula: (the value of the resistor 85/the sum of the values of the resistors 19 and 85) $[1+W_2/W_1($ the value of the resistor 59/the value of the resistor $23)](W_3/W_1)$ where $W_1$ is the number of turns of the first primary winding 45, $W_2$ is the number of turns of the second primary winding 47, and $W_3$ is the number of turns of the secondary winding 49. Also, it should be pointed out that the amplifier means 27 is a differential amplifier with output capability sufficient to drive the low inductance of $W_1$ at low frequencies.

Although the invention has been described and illustrated with respect to a preferred embodiment thereof and a preferred use therefore, it is not to be so limited since changes and modifications can be made therein with or within the full intended scope of the invention.

I claim:

1. A transformer coupled amplifier circuit for transforming electrical energy from a drive circuit to a driven circuit without any transformer induced non-linearities, said drive circuit having a positive input voltage signal and/or a negative input voltage signal, said circuit comprising:
   (a) input conditioning means for receiving and conditioning said input voltage signals from said drive circuit and for providing a positive conditioned output signal and/or a negative conditioned output signal, said input conditioning means including a first resistor for receiving said positive input voltage signal of said drive circuit and a second resistor for receiving said negative input voltage signal;
   (b) differential amplifier means for receiving and amplifying the difference between said conditioned output signals of said input conditioning means and for providing a single ended output signal having, in part, a direct current voltage, said differential amplifier means including an amplifier having a positive input for receiving said positive conditioned output signal from said input conditioning means, having a negative input for receiving said negative conditioned output signal from said input conditioning means, and having a single output;
   (c) current booster means for boosting the single ended output signal of said differential amplifier means;
   (d) output transformer means for receiving and isolating said single ended output from said current booster means and for providing an alternating current feedback signal said output transformer means including a transformer having a first primary winding for receiving said single ended output signal from said current booster means, having a second primary winding, and having a secondary winding for providing said driven circuit with electrical energy;
   (e) alternating current feedback means for scaling and conditioning said alternating feedback signal of said output transformer means for feedback to said differential amplifier means;
   (f) inverting amplifier means for monitoring said direct current voltage of said output signal of said differential amplifier means and for providing a direct current error signal; and
   (g) direct current feedback means for scaling and conditioning said direct current error signal of said inverting amplifier means for feedback to said differential amplifier means.

2. The circuit of claim 1 in which said alternating current feedback means includes a resistor associated with said second primary winding of said output transformer means for receiving said alternative current feedback current from said output transformer means.

3. The circuit of claim 2 in which said inverting amplifier means includes a resistor for receiving direct current voltage from said differential amplifier means, includes an amplifier having a grounded positive input, having a negative input for receiving direct current voltage from said resistor, and having a single output; includes a resistor for bridging said amplifier; and includes a capacitor for bridging said amplifier.

4. The circuit of claim 3 in which said direct current feedback means includes a resistor for receiving said direct current error signal from said output of said amplifier of said inverting amplifier means and for feeding said direct current error signal to said positive input of said differential means.

* * * * *